(12) United States Patent
Li et al.

(10) Patent No.: US 12,334,674 B2
(45) Date of Patent: Jun. 17, 2025

(54) DIMM RETENTION ASSEMBLY FOR COMPRESSION MOUNT TECHNOLOGY AND LAND GRID ARRAY CONNECTOR LOADING

(71) Applicant: Intel Corporation, Santa Clara, CA (US)

(72) Inventors: Xiang Li, Portland, OR (US); George Vergis, Portland, OR (US); Phil Geng, Washougal, WA (US)

(73) Assignee: Intel Corporation, Santa Clara, CA (US)

( * ) Notice: Subject to any disclaimer, the term of this patent is extended or adjusted under 35 U.S.C. 154(b) by 770 days.

(21) Appl. No.: 17/470,646

(22) Filed: Sep. 9, 2021

(65) Prior Publication Data

US 2021/0408724 A1    Dec. 30, 2021

(51) Int. Cl.
*H01R 13/627* (2006.01)
*H05K 7/14* (2006.01)
*G06F 1/18* (2006.01)
*H01R 12/73* (2011.01)

(52) U.S. Cl.
CPC ......... *H01R 13/6272* (2013.01); *G06F 1/185* (2013.01); *H01R 12/73* (2013.01); *H01R 12/737* (2013.01); *H05K 7/1409* (2013.01)

(58) Field of Classification Search
CPC .. H01R 13/6272; H01R 12/73; H01R 12/737; H05K 7/12; G06F 1/185
See application file for complete search history.

(56) References Cited

U.S. PATENT DOCUMENTS

| | | | |
|---|---|---|---|
| 6,185,106 B1 * | 2/2001 | Mueller | H05K 7/1409 361/801 |
| 6,579,029 B1 * | 6/2003 | Sevde | H05K 7/1414 403/321 |
| 10,070,549 B2 * | 9/2018 | Su | H05K 7/1409 |
| 11,489,274 B2 * | 11/2022 | Wang | H05K 7/1489 |
| 2015/0327389 A1 * | 11/2015 | Westphall | H01R 13/62988 361/748 |

* cited by examiner

*Primary Examiner* — Michael C Zarroli
(74) *Attorney, Agent, or Firm* — Compass IP Law PC

(57) ABSTRACT

A memory module, a motherboard, and a latch assembly coupled to the memory module and the motherboard are described, the latch assembly including a connector coupled to the motherboard, a first lever coupled to the connector via a first pivot point, an load member extending through an opening in the first lever, a second lever coupled to the load member via a second pivot point, and a spring to bias the load member away from the opening in the first lever. The latch assembly may be used as a dual inline memory module (DIMM) retention assembly for compression mount technology (CMT) and land grid array (LGA) connector loading.

14 Claims, 2 Drawing Sheets

DIMM RETENTION ASSEMBLY FOR COMPRESSION MOUNT TECHNOLOGY AND LAND GRID ARRAY CONNECTOR LOADING

TECHNICAL FIELD

Embodiments generally relate to memory structures. More particularly, embodiments relate to dual inline memory module (DIMM) retention assemblies for compression mount technology (CMT) and land grid array (LGA) connector loading.

BACKGROUND

Current DIMM form factors use a card edge connector. For example, a typical Double Data Rate 5 (DDR5) connector latch design merely secures the DIMM into position. As a result, signal integrity performance (e.g., bandwidth) may decrease and pin counts (e.g., capacity) may be limited.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
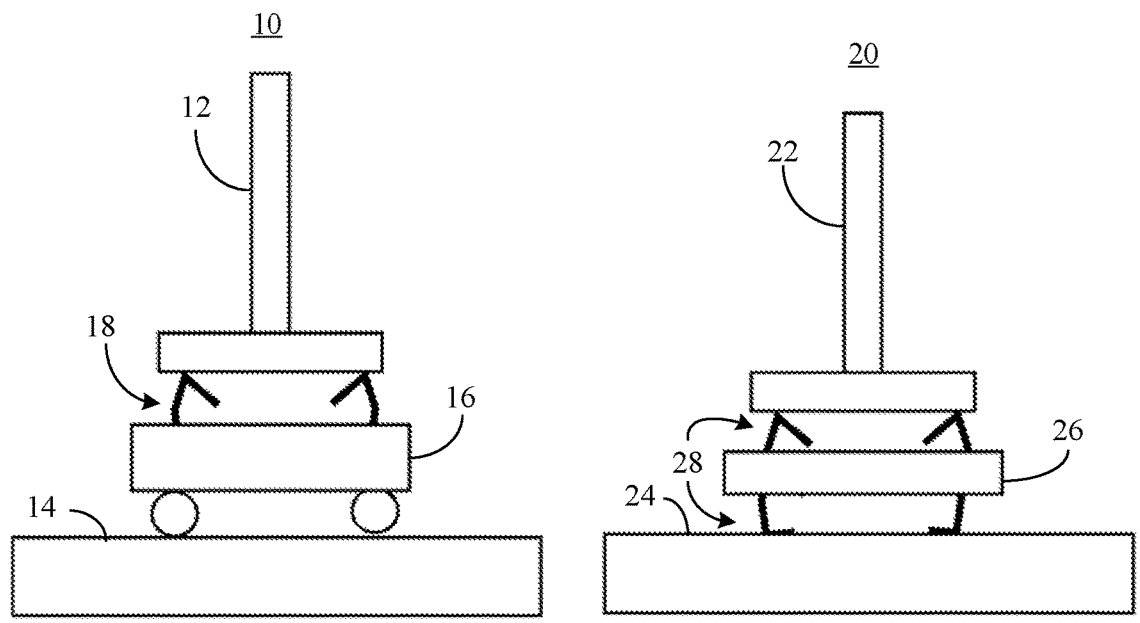
FIG. 1 is a side view of an example of an LGA connector and a CMT connector according to embodiments.

Turning now to FIG. 1, a first computing system 10 is shown in which a memory module 12 is coupled to a printed circuit board (PCB, e.g., motherboard) 14 via an LGA connector 16. In the illustrated example, compression forces are used to form electrical connections between contact pins 18 and the memory module 12. Additionally, a second computing system 20 includes a memory module 22 that is coupled to a PCB 24 via a CMT connector 26. Again, compression forces are used to form electrical connectors between contact pins 28 and the memory module 22. The compression forces generally provide better signal integrity performance (e.g., bandwidth) and an increased pin count (e.g., capacity) relative to conventional edge card connectors. As will be discussed in greater detail, embodiments provide for a latch assembly that facilitates the compression forces achieved in the first computing system 10 and the second computing system 20. As a result, embodiments provide enhanced performance relative to traditional edge card connector solutions.

Figure 2:
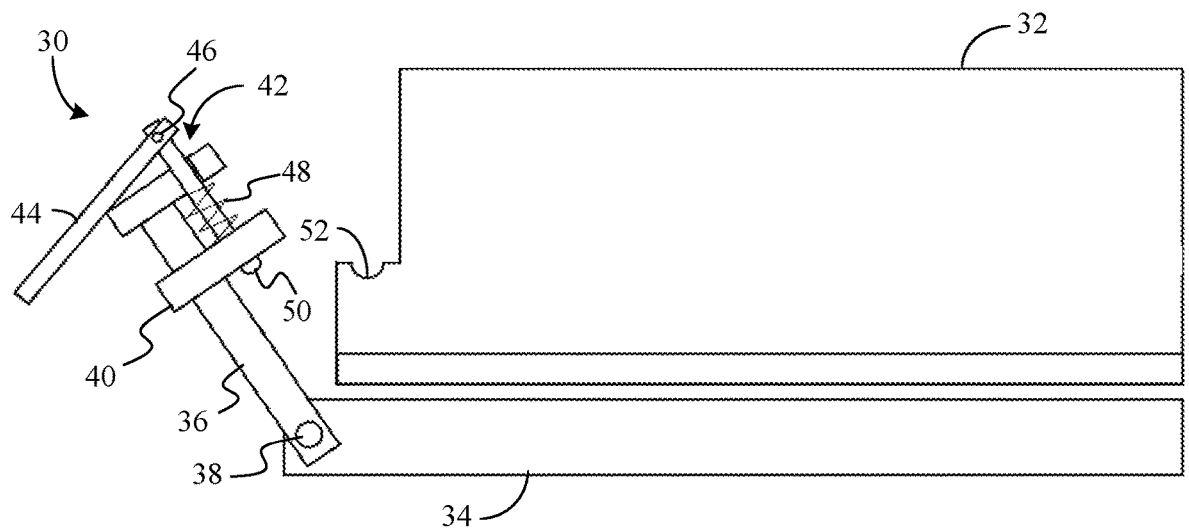
FIG. 2 is a side view of an example of a latch assembly in an open position according to an embodiment.

FIG. 2 shows a latch assembly 30 in an open position with respect to a memory module (e.g., DIMM). The illustrated latch assembly 30 includes a connector 34 (e.g., LGA connector, CMT connector) and an L-shaped lever 36 coupled to the connector 34 via a first pivot point 38 (e.g., pin, hinge). In an embodiment, the first pivot point 38 provides an axis (e.g., into the page) about which the L-shaped lever 36 rotates. The latch assembly 30 also includes an L-shaped load member 40 extending through an opening 42 in the L-shaped lever 36. A longitudinal (e.g., substantially straight) lever 44 is coupled to the L-shaped load member 40 via a second pivot point 46 (e.g., pin, hinge). In one example, the second pivot point 46 provides an axis (e.g., into the page) about which the longitudinal lever 44 rotates. The latch assembly 30 also includes a spring 48 to bias the L-shaped load member 40 away from the opening 42 in the L-shaped lever 36. As illustrated, spring 48 is located so as to coil around a portion of the L-shaped load member 40. Thus, in the open position as shown, the longitudinal lever 44 causes the L-shaped load member 40 to compress the spring 48 (e.g., due to a user action) and the L-shaped lever 36 may be rotated away from the memory module 32. The L-shaped lever 36 may alternatively be formed in a shape other than an L-shape (e.g., asymmetric T-shape).

Figure 3:
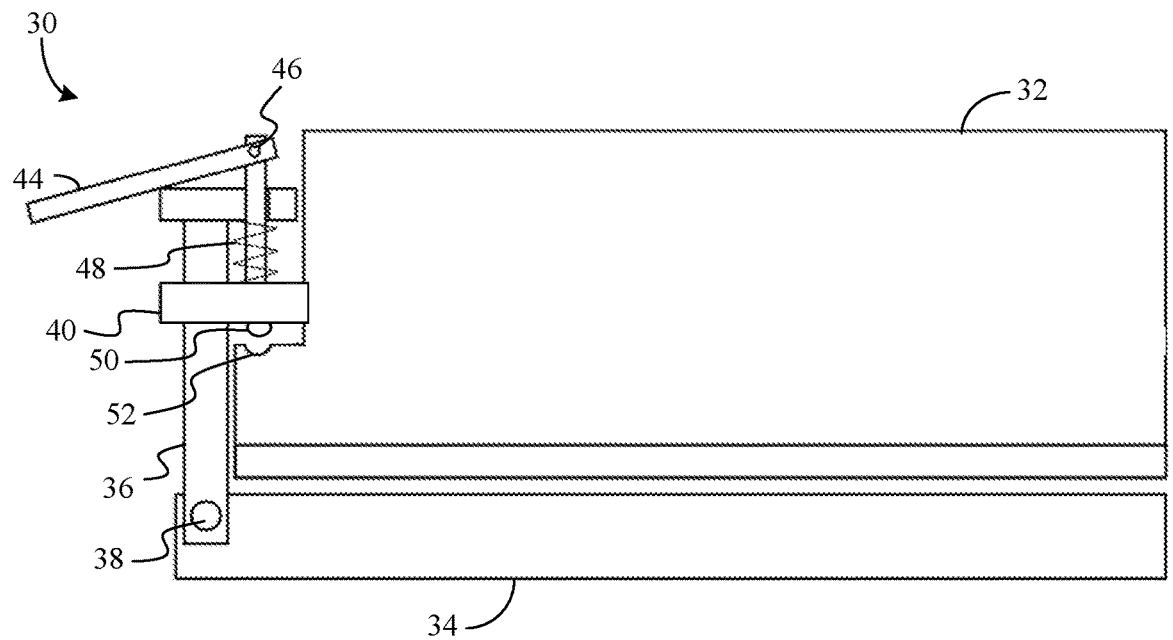
FIG. 3 is a side view of an example of a latch assembly in an installed position according to an embodiment.

FIG. 3 shows the latch assembly 30 in an installed position. More particularly, the L-shaped lever 36 is rotated towards the memory module 32 while the longitudinal lever 44 continues to cause the L-shaped load member 40 to compress the spring 48. Of particular note is that a protrusion 50 on the L-shaped load member 40 extends away from the spring 48 but has clearance to come into alignment with surfaces defining a recess 52 in the memory module 32.

Figure 4:
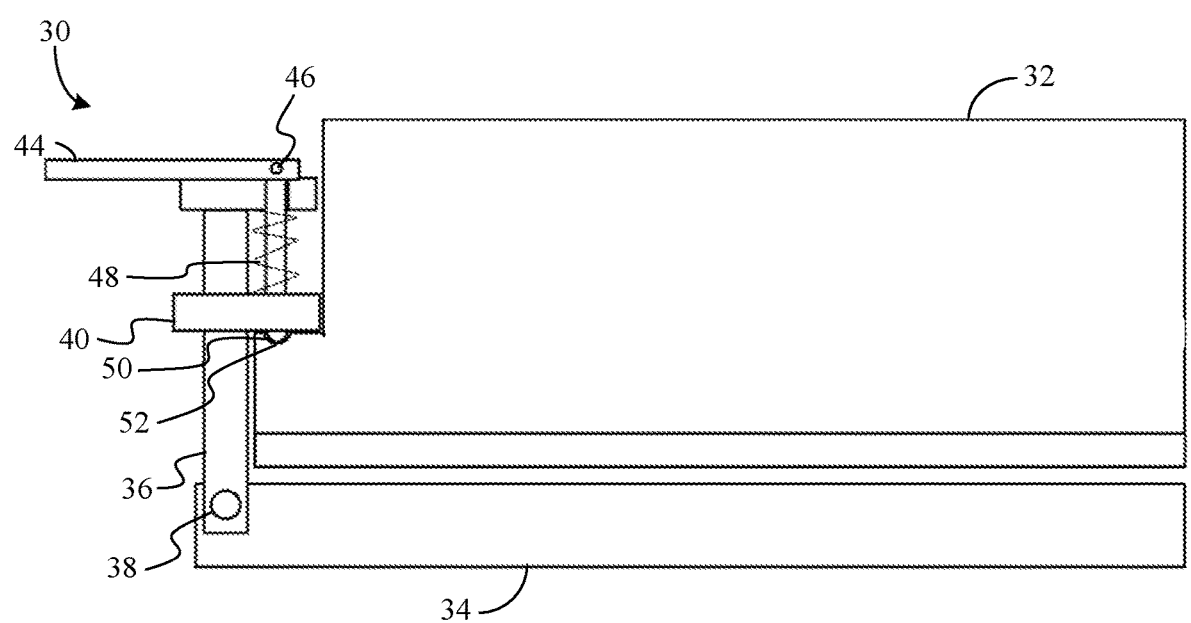
FIG. 4 is a side view of an example of a latch assembly in a latched position according to an embodiment.

FIG. 4 shows the latch assembly 30 in a latched position. More particularly, the L-shaped lever 36 has rotated toward the memory module 32 and the spring 48 engages the protrusion 50 with the recess 52 in the memory module 32. Thus, by releasing the longitudinal lever 44, the load is applied through a guided post of the L-shaped load member 40 to the memory module 32. As a result, the latch assembly 30 provides better signal integrity performance (e.g., bandwidth) and increased pin counts (e.g., capacity) with respect to CMT and LGA technologies. The new form factor and spring stiffness of the latch assembly 30 also enables the memory module 32 to meet electrical performance requirements associated with CMT and LGA technologies.

The memory module 32 may be part of a memory device that includes non-volatile memory and/or volatile memory. Non-volatile memory is a storage medium that does not require power to maintain the state of data stored by the medium. In one embodiment, the memory structure is a block addressable storage device, such as those based on NAND or NOR technologies. A storage device may also include future generation nonvolatile devices, such as a three-dimensional (3D) crosspoint memory device, or other byte addressable write-in-place nonvolatile memory devices. In one embodiment, the storage device may be or may include memory devices that use silicon-oxide-nitride-oxide-silicon (SONOS) memory, electrically erasable programmable read-only memory (EEPROM), chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The term "storage device" may refer to the die itself and/or to a packaged memory product. In some embodiments, 3D crosspoint memory may comprise a transistor-less stackable cross point architecture in which memory cells sit at the intersection of word lines and bit lines and are individually addressable and in which bit storage is based on a change in bulk resistance. In particular embodiments, a memory module with non-volatile memory may comply with one or more standards promulgated by the Joint Electron Device Engineering Council (JEDEC), such as JESD235, JESD218, JESD219, JESD220-1, JESD223B, JESD223-1, or other suitable standard (the JEDEC standards cited herein are available at jedec.org).

Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of the memory modules complies with a standard promulgated by JEDEC, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at jedec.org). Such standards (and similar standards) may be referred to as DDR-based standards and communication interfaces of the storage devices that implement such standards may be referred to as DDR-based interfaces.

Additional Notes and Examples

Example 1 includes a performance-enhanced computing system comprising a memory module, a motherboard, and a latch assembly coupled to the memory module and the motherboard, the latch assembly including a connector coupled to the motherboard, a first lever coupled to the connector via a first pivot point, an L-shaped load member extending through an opening in the first lever, a second lever coupled to the L-shaped load member via a second pivot point, and a spring to bias the L-shaped load member away from the opening in the first lever.

Example 2 includes the computing system of Example 1, wherein the L-shaped load member includes a protrusion extending away from the spring.

Example 3 includes the computing system of Example 2, wherein in a latched position, the first lever rotates toward the memory module and the spring engages the protrusion with a recess in the memory module.

Example 4 includes the computing system of Example 1, wherein in an open position, the second lever causes the L-shaped load member to compress the spring and the first lever rotates away from the memory module.

Example 5 includes the computing system of Example 1, wherein the connector is a land grid array connector.

Example 6 includes the computing system of Example 1, wherein the connector is a compression mount technology connector.

Example 7 includes the computing system of any one of Examples 1 to 6, wherein the first lever is an L-shaped lever and the second lever is a longitudinal lever.

Example 8 includes a latch assembly comprising a connector, a first lever coupled to the connector via a first pivot point, an L-shaped load member extending through an opening in the first lever, a second lever coupled to the L-shaped load member via a second pivot point, and a spring to bias the L-shaped load member away from the opening in the first lever.

Example 9 includes the latch assembly of Example 8, wherein the L-shaped load member includes a protrusion extending away from the spring.

Example 10 includes the latch assembly of Example 9, wherein in a latched position, the first lever rotates toward a memory module and the spring engages the protrusion with a recess in the memory module.

Example 11 includes the latch assembly of Example 8, wherein in an open position, the second lever causes the L-shaped load member to compress the spring and the first lever rotates away from a memory module.

Example 12 includes the latch assembly of Example 8, wherein the connector is a land grid array connector.

Example 13 includes the latch assembly of Example 8, wherein the connector is a compression mount technology connector.

Example 14 includes the latch assembly of any one of Examples 8 to 13, wherein the first lever is an L-shaped lever and the second lever is a longitudinal lever.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc.

may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A computing system comprising:
   a memory module;
   a motherboard; and
   a latch assembly coupled to the memory module and the motherboard, the latch assembly including:
   a connector coupled to the motherboard,
   a first lever coupled to the connector via a first pivot point,
   an L-shaped load member extending through an opening in the first lever,
   a second lever coupled to the L-shaped load member via a second pivot point, and
   a spring to bias the L-shaped load member away from the opening in the first lever, wherein the spring is located so as to coil around a portion of the L-shaped load member.

2. The computing system of claim 1, wherein the L-shaped load member includes a protrusion extending away from the spring.

3. The computing system of claim 2, wherein in a latched position, the first lever rotates toward the memory module and the spring engages the protrusion with a recess in the memory module.

4. The computing system of claim 1, wherein in an open position, the second lever causes the L-shaped load member to compress the spring and the first lever rotates away from the memory module.

5. The computing system of claim 1, wherein the connector is a land grid array connector.

6. The computing system of claim 1, wherein the connector is a compression mount technology connector.

7. The computing system of claim 1, wherein the first lever is an L-shaped lever and the second lever is a longitudinal lever.

8. A latch assembly comprising:
   a connector;
   a first lever coupled to the connector via a first pivot point;
   an L-shaped load member extending through an opening in the first lever;
   a second lever coupled to the L-shaped load member via a second pivot point; and
   a spring to bias the L-shaped load member away from the opening in the first lever, wherein the spring is located so as to coil around a portion of the L-shaped load member.

9. The latch assembly of claim 8, wherein the L-shaped load member includes a protrusion extending away from the spring.

10. The latch assembly of claim 9, wherein in a latched position, the first lever rotates toward a memory module and the spring engages the protrusion with a recess in the memory module.

11. The latch assembly of claim 8, wherein in an open position, the second lever causes the L-shaped load member to compress the spring and the first lever rotates away from a memory module.

12. The latch assembly of claim 8, wherein the connector is a land grid array connector.

13. The latch assembly of claim 8, wherein the connector is a compression mount technology connector.

14. The latch assembly of claim 8, wherein the first lever is an L-shaped lever and the second lever is a longitudinal lever.

* * * * *